United States Patent
Jiroku

(10) Patent No.: US 9,634,174 B2
(45) Date of Patent: Apr. 25, 2017

(54) PHOTOELECTRIC CONVERSION APPARATUS AND ELECTRONIC DEVICE

(71) Applicant: SEIKO EPSON CORPORATION, Tokyo (JP)

(72) Inventor: Hiroaki Jiroku, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/631,386

(22) Filed: Feb. 25, 2015

(65) Prior Publication Data

US 2015/0270429 A1 Sep. 24, 2015

(30) Foreign Application Priority Data

Mar. 18, 2014 (JP) .................................. 2014-054504

(51) Int. Cl.
*H01L 31/105* (2006.01)
*H01L 27/146* (2006.01)
*G06K 9/00* (2006.01)

(52) U.S. Cl.
CPC ...... *H01L 31/105* (2013.01); *H01L 27/14603* (2013.01); *H01L 27/14612* (2013.01); *H01L 27/14692* (2013.01); *G06K 9/00013* (2013.01); *G06K 2009/0006* (2013.01); *G06K 2009/00932* (2013.01)

(58) Field of Classification Search
None
See application file for complete search history.

(56) References Cited

U.S. PATENT DOCUMENTS

| 5,079,426 | A * | 1/1992 | Antonuk | A61B 6/032 250/370.06 |
| 8,138,004 | B2 * | 3/2012 | Sugawara | H01L 31/02240 257/290 |
| 8,154,096 | B2 * | 4/2012 | Sasagawa | H01L 27/14643 257/431 |
| 9,277,896 | B2 * | 3/2016 | Ofuji | H01L 27/14663 |
| 2010/0163882 | A1 * | 7/2010 | Jung | H01L 27/14632 257/59 |
| 2011/0073979 | A1 * | 3/2011 | Okada | H01L 31/03528 257/458 |
| 2013/0149809 | A1 * | 6/2013 | Yamada | H01L 27/14663 438/87 |

FOREIGN PATENT DOCUMENTS

JP 2000-156522 A 6/2000

* cited by examiner

*Primary Examiner* — Benjamin Sandvik
(74) *Attorney, Agent, or Firm* — Global IP Counselors, LLP

(57) ABSTRACT

A photoelectric conversion apparatus includes a substrate 13 and a photodiode 9 in which a first semiconductor layer 25, a second semiconductor layer 26 and a third semiconductor layer 27 are laminated on the substrate 13 in the stated order. The second semiconductor layer 26 is an i-type semiconductor layer, and one of the first semiconductor layer 25 and the third semiconductor layer 27 is an n-type semiconductor layer, and the other is a p-type semiconductor layer. Also, the first semiconductor layer 25 is covered by the second semiconductor layer 26.

6 Claims, 9 Drawing Sheets

PHOTOELECTRIC CONVERSION APPARATUS AND ELECTRONIC DEVICE

This application claims a priority to Japanese Patent Application No. 2014-054504 filed on Mar. 18, 2014 which is hereby expressly incorporated by reference in its entirety.

BACKGROUND

1. Technical Field

Several aspects of the present invention relate to a photoelectric conversion apparatus and an electronic device.

2. Related Art

Photoelectric conversion apparatuses are used in apparatuses that capture two-dimensional images of a large high performance screen for medical use, apart from being used in electrical appliances such as facsimile machines and scanners. A photoelectric conversion apparatus in which photoelectric conversion parts are arranged two-dimensionally is disclosed in JP-A-2000-156522. According to JP-A-2000-156522, amorphous silicon semiconductor layers are used in the photoelectric conversion parts, with the layers being structured such that an i-type semiconductor layer is sandwiched between a p-type semiconductor layer and an n-type semiconductor layer. An electric field is applied to the laminated semiconductor layers and light is input.

Carriers are generated in the i-type semiconductor layer when light is input into the i-type semiconductor layer. Current flows as a result of the carriers flowing from the p-type semiconductor layer and the n-type semiconductor layer. Because the intensity of light with which the photoelectric conversion parts are irradiated is correlated with the current, it is possible for the photoelectric conversion apparatus to electrically convert and output the distribution of light intensity.

In the photoelectric conversion parts of JP-A-2000-156522, the n-type semiconductor layer, the i-type semiconductor layer and the p-type semiconductor layer have approximately the same planar shape. The i-type semiconductor layer is not doped with impurities. In the process of patterning the i-type semiconductor layer into a predetermined planar shape, the i-type semiconductor layer is masked to a predetermined shape and etched. Some of the masking material or etching solution may remain on lateral surfaces that are located on the outer periphery of the i-type semiconductor layer. Also, crystal defects may occur in these places. If there are impurities adhering to the semiconductor layers or there are crystal defects, current flows readily through these places. Accordingly, current leakage tends to occur at lateral surfaces that are located on the outer periphery of the i-type semiconductor layer when the electric field is applied. For this reason, a photoelectric conversion apparatus having a structure in which current does not readily leak when light is not input is desired.

SUMMARY

Advantages of some aspects of the invention can be realized as the following illustrative embodiments or application examples.

Application Example 1

A photoelectric conversion apparatus according to the present application example includes a substrate, and a light detection part in which a first semiconductor layer, a second semiconductor layer and a third semiconductor layer are laminated on the substrate in the stated order. The second semiconductor layer is an i-type semiconductor layer, and one of the first semiconductor layer and the third semiconductor layer is an n-type semiconductor layer and the other is a p-type semiconductor layer. Also, the first semiconductor layer is covered by the second semiconductor layer.

According to the present application example, the second semiconductor layer is structured to cover the first semiconductor layer. The second semiconductor layer is provided to extend to the outer side of the surrounding area of the first semiconductor layer. Accordingly, the outer periphery of the second semiconductor layer is located on the outer side of the first semiconductor layer. Thus, the outer periphery of the second semiconductor layer is not disposed between the first semiconductor layer and the third semiconductor layer. The second semiconductor layer is an i-type semiconductor layer, and current flows readily through any impurities or lattice defects that exist therein. Also, the effects of etching may remain in portions that will form the outer periphery of the second semiconductor layer. Thus, current tends to leak in places that will form the outer periphery of the second semiconductor layer. However, with the photoelectric conversion apparatus of the present application example, places in the second semiconductor layer where current tends to leak are disposed away from the first semiconductor layer. Accordingly, current leakage in the photoelectric conversion apparatus when light is not input can be reduced.

Application Example 2

In the photoelectric conversion apparatus according to the above application example, the third semiconductor layer may include a place opposing the first semiconductor layer and may be larger in area than the first semiconductor layer in plan view from a thickness direction of the substrate.

According to the present application example, the third semiconductor layer is provided opposing the first semiconductor layer. Furthermore, the third semiconductor layer is larger in area than the first semiconductor layer. Because light is thereby also converted into electricity by light input into the second semiconductor layer located peripherally to the first semiconductor layer in plan view seen from the thickness direction of the substrate, current corresponding to the light can be efficiently caused to flow.

Application Example 3

In the photoelectric conversion apparatus according to the above application example, the second semiconductor layer and the third semiconductor layer may have the same planar shape in plan view from the thickness direction of the substrate.

According to the present application example, the second semiconductor layer and the third semiconductor layer have the same planar shape. Accordingly, it is possible for current to flow from the third semiconductor layer to the second semiconductor layer at all places. As a result, current corresponding to the light can be efficiently caused to flow.

Application Example 4

In the photoelectric conversion apparatus according to the above application example, the second semiconductor layer may be thicker than the first semiconductor layer, and the second semiconductor layer may be thicker than the third semiconductor layer.

According to the present application example, the second semiconductor layer is thicker than the first semiconductor layer and the third semiconductor layer. The second semiconductor layer is an i-type semiconductor layer, and the i-type semiconductor layer absorbs energy from light and generates carriers. Accordingly, since light is efficiently converted into electricity when the i-type semiconductor layer is thicker rather than thinner, the photoelectric conversion apparatus is able to efficiently cause current corresponding to the light to flow.

Application Example 5

An electronic device according to the present application example is provided with a photoelectric conversion apparatus, and this photoelectric conversion apparatus may be any one of the photoelectric conversion apparatus described above.

According to the present application example, an electronic device is provided with a photoelectric conversion apparatus. The electronic device drives the photoelectric conversion apparatus and converts light into an electrical signal. The above photoelectric conversion apparatuses are used for this photoelectric conversion apparatus. Accordingly, an electronic device can be realized in which current leakage when light is not input is reduced. Also, an electronic device that is able to detect low amounts of light can be constituted, given that leakage current of the photoelectric conversion apparatus is further reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

In the embodiments, characteristic examples of a photoelectric conversion apparatus will be described in accordance with the drawings. Note that, in the following diagrams, the scale of the layers and members is differentiated from the actual scale, in order to facilitate recognition of the individual layers and members. Also, in the following illustrative embodiments, the phrase "on the substrate", for example, is intended to include the following three cases. In the first case, a constituent part or the like is disposed on the substrate in contact therewith. In the second case, a constituent part or the like is disposed on the substrate via another constituent part. In the third case, a constituent part or the like is disposed on the substrate partially in contact therewith and partially via another constituent part.

First Embodiment

Figure 1A:
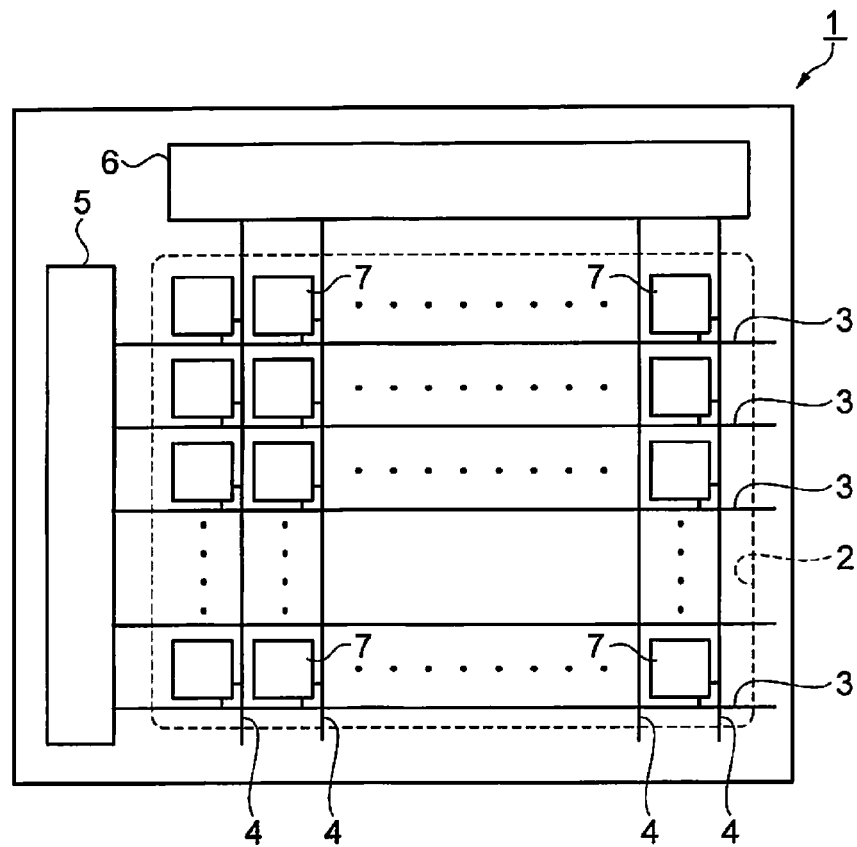
FIGS. 1A and 1B relate to the first embodiment, with FIG. 1A being a schematic connection diagram showing the electrical configuration of an image sensor, and FIG. 1B being an equivalent circuit diagram of a photo sensor.
Figure 1B:
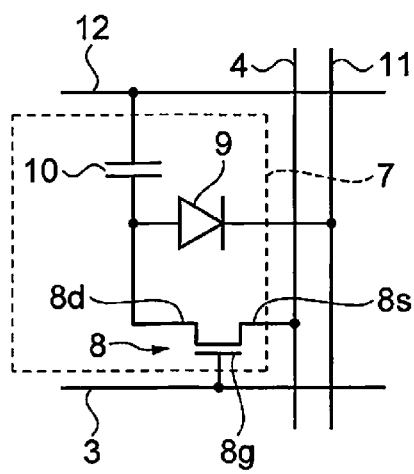
Figure 2A:
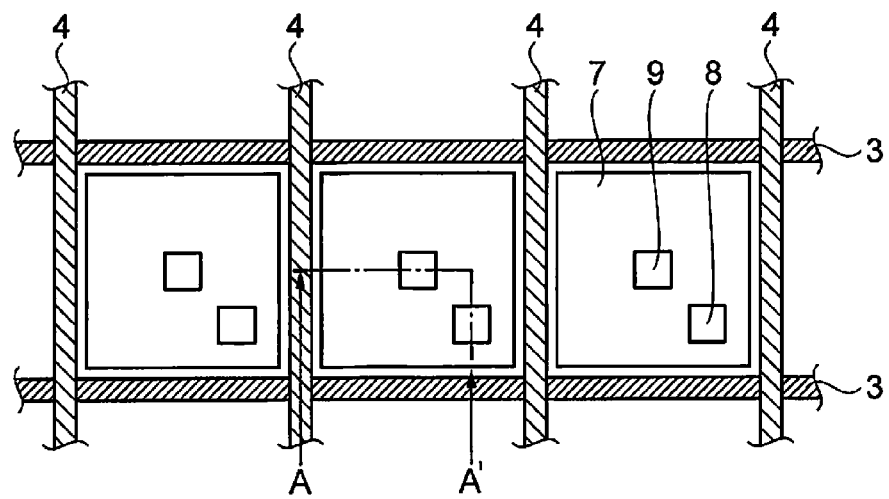
FIG. 2A is schematic partial plan view showing the arrangement of photo sensors.
Figure 2B:
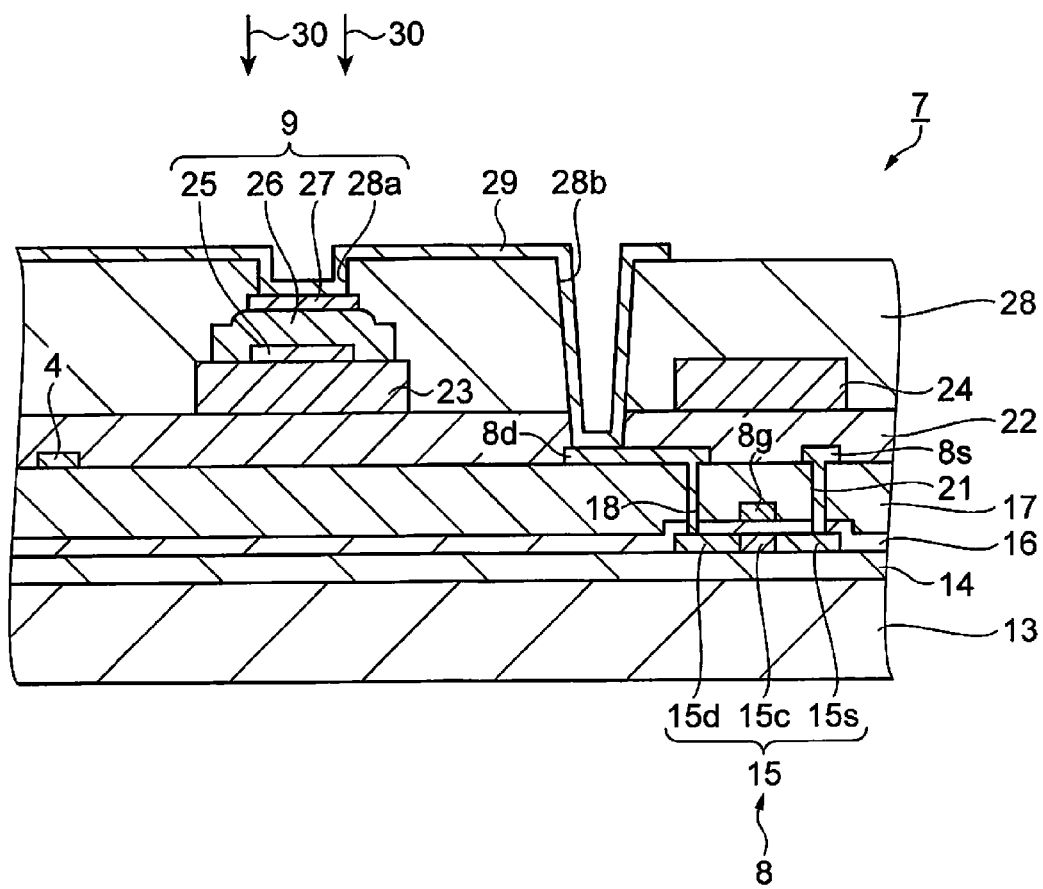
FIG. 2b is a schematic cross-sectional view showing the structure of a photo sensor.
Figure 3:
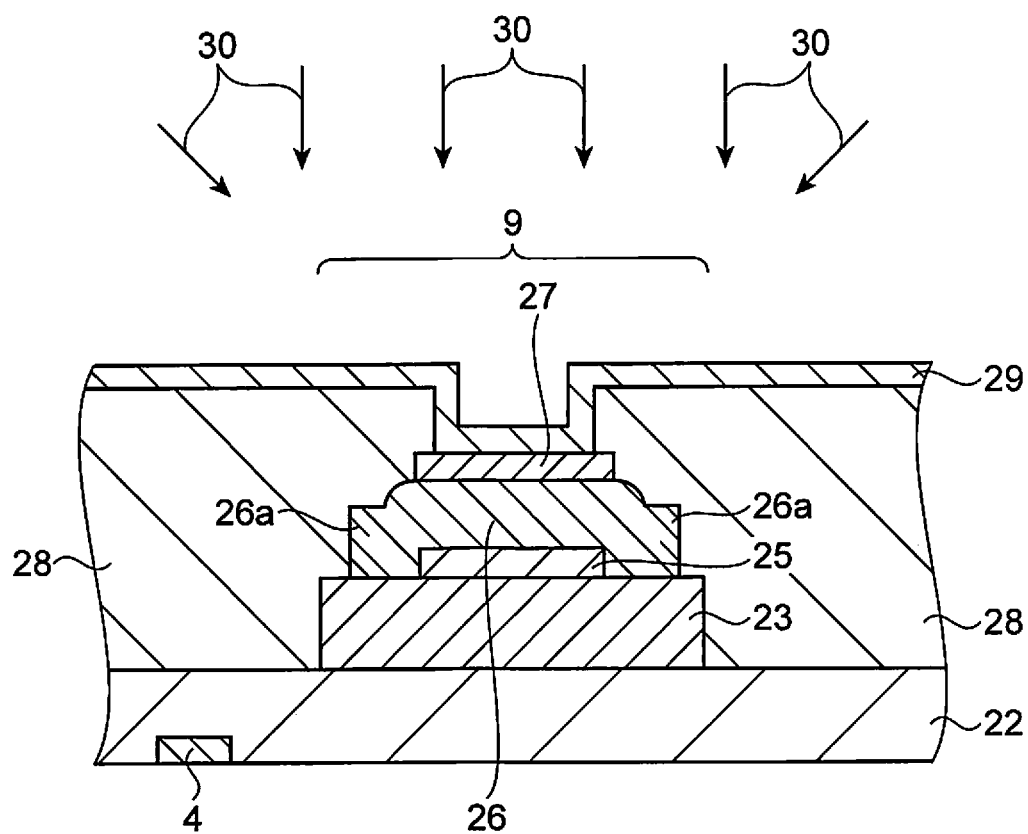
FIG. 3 is a schematic enlarged cross-sectional view showing a main section of the structure of a photo sensor.

An image sensor relating to a first embodiment will be described in accordance with FIGS. 1 to 5. FIG. 1A is a schematic connection diagram showing an electrical configuration of the image sensor. FIG. 1B is an equivalent circuit diagram of a photo sensor. FIG. 2A is a schematic partial plan view showing the arrangement of photo sensors, and FIG. 2B is a schematic cross-sectional view showing the structure of a photo sensors along an A-A' line in FIG. 2A. FIG. 3 is a schematic enlarged cross-sectional view showing a main section of the structure of a photo sensor.

As shown in FIG. 1A, an image sensor 1 serving as a photoelectric conversion apparatus of the present embodiment is provided with an element region 2. A plurality of scan lines 3 and a plurality of data lines 4 that extend and intersect each other are provided in the element region 2. A scan line circuit 5 serving as a drive part to which the plurality of scan lines 3 are electrically connected is provided to the left of the element region 2 in the diagram, and a data line circuit 6 serving as a drive part to which the plurality of data lines 4 are electrically connected is provided on the upper side of the element region 2 in the diagram. Photo sensors 7 serving as photoelectric conversion elements are provided near the intersections of the scan lines 3 and the data lines 4. The photo sensors 7 are disposed in a matrix in the element region 2, and output the pixels of images that are captured by the image sensor 1.

As shown in FIG. 1B, the photo sensors 7 are provided with a thin film transistor 8 serving as a switching element, a photodiode 9 serving as a light detection part, and a storage capacitor 10. The thin film transistor 8 is also referred to as a TFT (thin film transistor). A gate electrode 8g of the thin film transistor 8 is connected to a scan line 3, and a source electrode 8s of the thin film transistor 8 is connected to a data line 4. One end of the photodiode 9 is connected to a drain electrode 8d of the thin film transistor 8, and the other end is connected to a constant potential line 11 provided in parallel with the data line 4. One electrode of the storage capacitor 10 is connected to the drain electrode 8d of the thin film transistor 8, and the other electrode is connected to a constant potential line 12 provided in parallel with the scan line 3.

As shown in FIG. 2A, the photo sensors 7 are square in shape and are provided in regions planarly partitioned by the scan lines 3 and the data lines 4. The photodiode 9 is disposed in the center of each photo sensor 7, and the thin film transistor 8 is disposed on the lower right of the photodiode 9 in the diagram. The storage capacitor 10 is omitted in the diagram.

As shown in FIG. 2B, the photo sensor 7 is formed on a substrate 13 of transparent glass, opaque silicon or the like, for example. A base insulation film 14 of silicon oxide ($SiO_2$) is formed on the substrate 13 so as to cover the surface of the substrate 13. An island-like semiconductor film 15 of polycrystalline silicon having a film thickness of about 50 nm, for example, is formed on the base insulation film 14. The semiconductor film 15 consists of a source region 15s, a drain region 15d and a channel forming region 15c, with the channel forming region 15c being disposed between the source region 15s and the drain region 15d. Furthermore, a gate insulation film 16 is provided to cover the semiconductor film 15. The gate insulation film 16 is constituted by an insulating material of $SiO_2$ or the like having a film thickness of about 100 nm, for example. The gate insulation film 16 also covers the base insulation film 14 as well as covering the semiconductor film 15.

The gate electrode 8g is provided on the gate insulation film 16 at a position opposing the channel forming region 15c of the semiconductor film 15. The gate electrode 8g is electrically connected to a scan line 3, and is formed using a metal material such as molybdenum (Mo) having a film thickness of about 500 nm, for example.

A first interlayer insulation film 17 is provided to cover the gate electrode 8g and the gate insulation film 16. The first interlayer insulation film 17 is constituted by $SiO_2$ having a film thickness of about 800 nm. A contact hole 18 connecting to the drain region 15d and a contact hole 21 connecting to the source region 15s are provided in the gate insulation film 16 and the first interlayer insulation film 17.

A conduction film made of a metal material such as Mo having a film thickness of about 500 nm, for example, is provided so as to cover the first interlayer insulation film 17 as well as filling the contact hole 18 and the contact hole 21. The drain electrode 8d, the source electrode 8s and the data line 4 are provided by patterning this conduction film. The source electrode 8s is connected to the source region 15s of the semiconductor film 15 through the contact hole 21, and the source electrode 8s is also further connected to the data line 4. The drain electrode 8d is connected to the drain region 15d of the semiconductor film 15 through the contact hole 18. A second interlayer insulation film 22 is provided to cover the drain electrode 8d, the source electrode 8s, the data line 4 and the first interlayer insulation film 17. The second interlayer insulation film 22 is constituted by silicon nitride ($Si_3N_4$) having a film thickness of about 800 nm, for example.

A lower electrode 23 of the photodiode 9 is formed on the second interlayer insulation film 22. The material of the lower electrode 23 need only be a conductive material, and preferably is a low resistance metal. For example, aluminum is used for the material of the lower electrode 23 in the present embodiment. Because the lower electrode 23 is connected to the constant potential line 11, the lower electrode 23 and the constant potential line 11 may be made of the same material and provided on the same layer.

Hereinafter, viewing from the thickness direction of films that are formed on the substrate 13 will be referred to as "in plan view". An island-like shading film 24 is formed on the second interlayer insulation film 22 in a place overlapping the thin film transistor 8 in plan view. The shading film 24 is formed in a region overlapping the semiconductor film 15 in plan view. The shading film 24 prevents the thin film transistor 8 from being irradiated with light 30 that travels from above the substrate 13 in the diagram. In particular, light is prevented from being incident on the semiconductor film 15.

In the photodiode 9, a first semiconductor layer 25, a second semiconductor layer 26 and a third semiconductor layer 27 are laminated on the lower electrode 23 in the stated order. The first semiconductor layer 25 is an n-type semiconductor layer, and is a semiconductor layer in which phosphorus or arsenic has been added to silicon. The first semiconductor layer 25 is structured to include a large number of free electrons as carriers. The second semiconductor layer 26 is an i-type semiconductor layer, and is an intrinsic semiconductor layer. The third semiconductor layer 27 is a p-type semiconductor layer, and is a semiconductor layer in which boron or indium has been added to silicon. The third semiconductor layer 27 is structured to include a large number of positive holes as carriers.

A third interlayer insulation film 28 is provided to cover the second interlayer insulation film 22, the lower electrode 23, the shading film 24, the first semiconductor layer 25, the second semiconductor layer 26, and the third semiconductor layer 27. The third interlayer insulation film 28 is formed using $Si_3N_4$, for example.

A contact hole 28a connecting to the third semiconductor layer 27 is provided in the third interlayer insulation film 28. Furthermore, a contact hole 28b connecting to the drain electrode 8d is provided in the third interlayer insulation film 28 and the second interlayer insulation film 22. A transparent electrode 29 is provided in the contact hole 28a and the contact hole 28b. The transparent electrode 29 is able to use a transparent conductive film of ITO (indium tin oxide), IZO (indium zinc oxide) or the like at a film thickness of about 100 nm, for example. The transparent electrode 29 connects the drain electrode 8d and the third semiconductor layer 27. Furthermore, the transparent electrode 29 is also connected to an electrode of the storage capacitor 10.

The photodiode 9 is constituted by the lower electrode 23, the first semiconductor layer 25, the second semiconductor layer 26, the third semiconductor layer 27 and the transparent electrode 29.

A circuit part is constituted by the scan lines 3, the data lines 4, the constant potential lines 11, the constant potential lines 12, the thin film transistors 8, the storage capacitors 10, the data line circuit 6, the scan line circuit 5 and the like provided on the substrate 13. Note that the data line circuit 6 to which the data lines 4 are connected, and the scan line circuit 5 to which the scan lines 3 are connected can also be respectively attached separately to the substrate 13 as integrated circuits.

The light 30 is incident on the photodiode 9 in a state where reverse bias is applied to the photodiode 9 using the constant potential line 11 and the constant potential line 12. Current corresponding to the intensity of light thereby flows in the photodiode 9 having the first semiconductor layer 25, the second semiconductor layer 26 and the third semiconductor layer 27, and electric charge accumulates in the storage capacitor 10 according to the amount of current.

Also, the thin film transistors 8 are turned on (selected) by controlling the voltage of each of the plurality of scan lines 3. Voltage signals corresponding to the electric charge accumulated in the storage capacitors 10 that are provided in the respective photo sensors 7 are sequentially output to the data lines 4. Accordingly, the intensity of light received by the photo sensors 7 in each element region 2 can be respectively detected.

As shown in FIG. 3, the first semiconductor layer 25 is covered by the second semiconductor layer 26. In plan view, the second semiconductor layer 26 occupies a larger area than the first semiconductor layer 25. The second semiconductor layer 26 is provided to extend to the outer side of the surrounding area of the first semiconductor layer 25. Accordingly, an outer periphery 26a of the second semiconductor layer 26 is located on the outer side of the first semiconductor layer 25. Thus, the outer periphery 26a of the second semiconductor layer 26 is not disposed between the first semiconductor layer 25 and the third semiconductor layer 27. The second semiconductor layer 26 is an i-type semiconductor layer, and current flows readily through any impurities or lattice defects that exist therein. The effects of etching may remain in portions that form the outer periphery 26a of the second semiconductor layer 26. For this reason, current leakage tends to occur in places that form the outer periphery of the second semiconductor layer 26. In the photodiode 9, places on the second semiconductor layer 26 where current tends to leak do not exist in the place sandwiched between the first semiconductor layer 25 and the third semiconductor layer 27. Accordingly, a configuration in which current leakage does not readily occur in the photodiode 9 when the light 30 is not incident thereon can be realized. As a result, current flow in the photodiode 9 when the light 30 is not incident on the photodiode 9 can be suppressed.

The second semiconductor layer 26 is thicker than the first semiconductor layer 25, and the second semiconductor layer 26 is thicker than the third semiconductor layer 27. The second semiconductor layer 26 is an i-type semiconductor layer, and the i-type semiconductor layer absorbs energy from light and causes electricity to flow. Accordingly, the second semiconductor layer 26 is able to convert the intensity of light into an electrical signal more efficiently when thicker rather than when thinner. When the thickness of the photodiode 9 is prescribed to a predetermined thickness, the second semiconductor layer 26 can be increased in thickness by making the first semiconductor layer 25 and the third semiconductor layer 27 thinner than the second semiconductor layer 26. As a result, the photodiode 9 is able to efficiently convert the intensity of light into electrical signals.

Next, a method of manufacturing the photo sensor 7 will be described using FIGS. 4 and 5. FIGS. 4 and 5 are schematic cross-sectional views for illustrating a method of manufacturing the photo sensor.

Figure 4A:
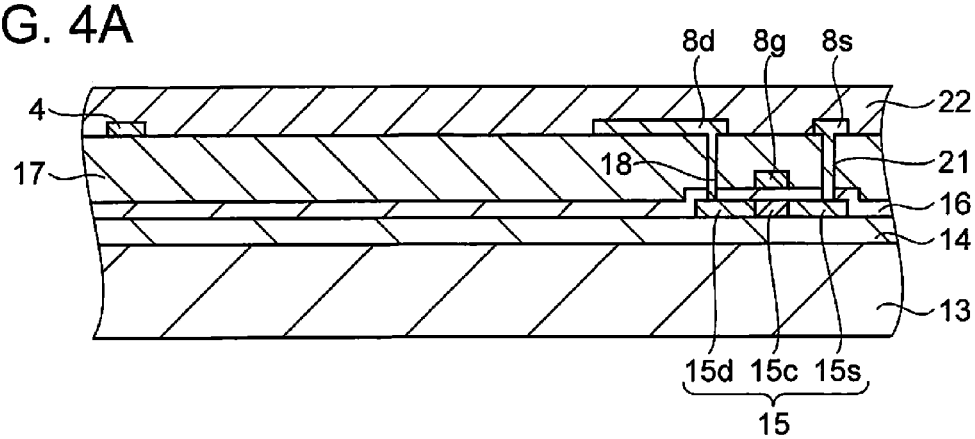
FIGS. 4A to 4C are schematic cross-sectional views for illustrating a method of manufacturing a photo sensor.

As shown in FIG. 4A, the substrate 13 of glass, silicon or the like is prepared first. Next, the base insulation film 14 of SiO$_2$ is formed by chemical vapor deposition (CVD) or the like. Next, an amorphous silicon film having a film thickness of about 50 nm is formed by CVD or the like on the base insulation film 14. The amorphous silicon film is crystallized by laser crystallization or the like to form a polycrystalline silicon film. Thereafter, the island-like semiconductor film 15, which is a polycrystalline silicon film, is formed by photolithography or the like.

Next, SiO$_2$ having a film thickness of about 100 nm is formed by CVD or the like, so as to cover the semiconductor film 15 and the base insulation film 14, thus forming the gate insulation film 16. A Mo film having a film thickness of about 500 nm is formed on the gate insulation film 16 by sputtering or the like, and the island-like gate electrode 8g is formed by photolithography. Impurity ions are implanted into the semiconductor film 15 by ion implantation to form the source region 15s, the drain region 15d, and the channel forming region 15c. An SiO$_2$ film having a film thickness of about 800 nm is formed, so as to cover the gate insulation film 16 and the gate electrode 8g, thus forming the first interlayer insulation film 17.

Next, the contact hole 21 that reaches the source region 15s and the contact hole 18 that reaches the drain region 15d are formed in the first interlayer insulation film 17. Thereafter, a Mo film having a film thickness of about 500 nm is formed by sputtering or the like on the first interlayer insulation film 17 and in the contact hole and the contact hole 21, and is patterned by photolithography to form the source electrode 8s, the drain electrode 8d, and the data line 4.

An Si$_3$N$_4$ film having a film thickness of about 800 nm is formed, so as to cover the first interlayer insulation film 17, the source electrode 8s, the drain electrode 8d, and the data line 4, thus forming the second interlayer insulation film 22.

Figure 4B:
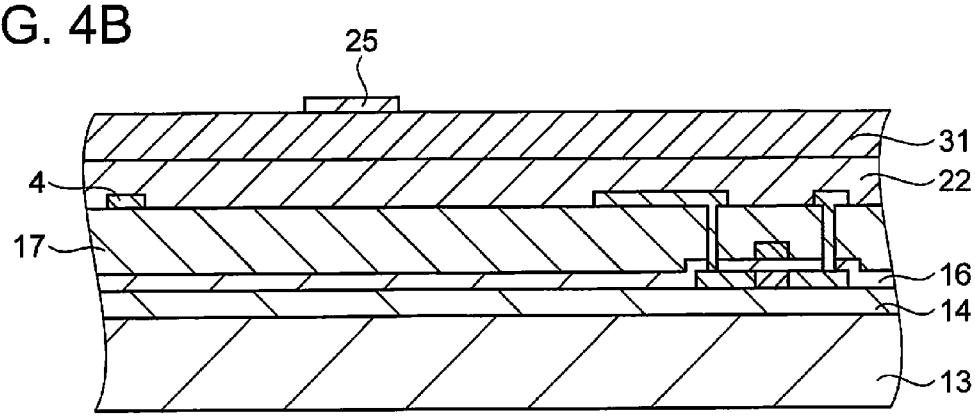

As shown in FIG. 4B, an aluminum film 31 having a film thickness of about 500 nm is formed as a conduction film by sputtering or the like on the second interlayer insulation film 22. Thereafter, an amorphous silicon film having a film thickness of about 50 nm is formed by CVD or the like on the aluminum film 31. The amorphous silicon film is crystallized by laser crystallization or the like to form a microcrystalline silicon film. Thereafter, an island-like microcrystalline silicon film is formed by photolithography or the like. Next, impurity ions are implanted into the microcrystalline silicon film by ion implantation to form the first semiconductor layer 25.

Figure 4C:
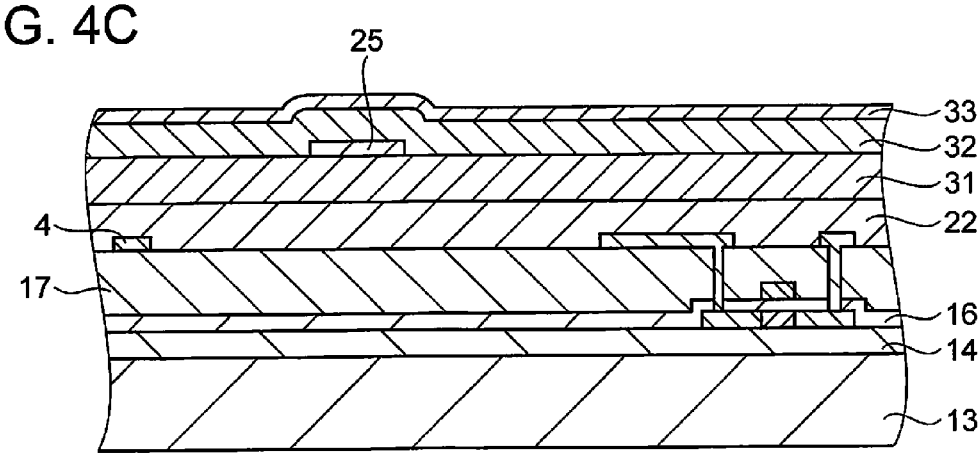

As shown in FIG. 4C, an amorphous silicon film having a film thickness of about 450 nm is formed by CVD or the like on the aluminum film 31 and the first semiconductor layer 25. The amorphous silicon film is crystallized by laser crystallization or the like to form a microcrystalline silicon film. Thereafter, impurity ions are then implanted into the microcrystalline silicon film by ion implantation at a depth of about 50 nm. An intrinsic region of the microcrystalline silicon film where the impurity ions do not reach forms a second unpatterned semiconductor film 32, and the region in which the impurity ions were implanted forms a third unpatterned semiconductor film 33.

Figure 5A:
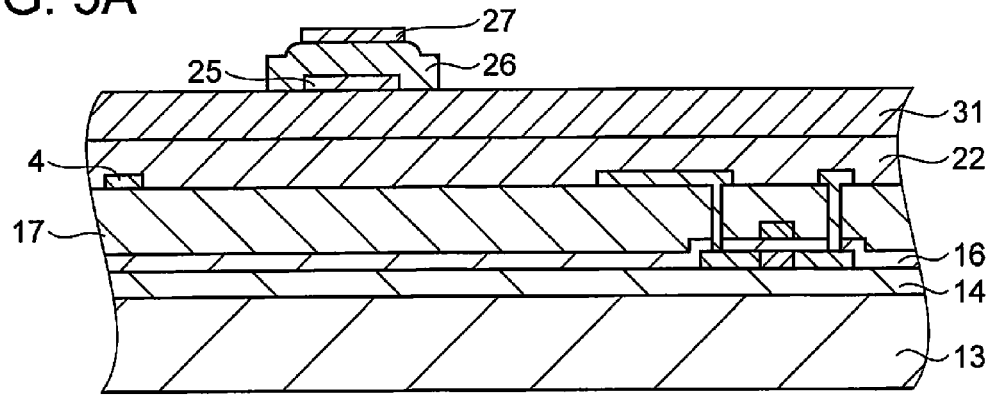
FIGS. 5A to 5C are schematic cross-sectional views for illustrating a method of manufacturing a photo sensor.
Figure 5B:
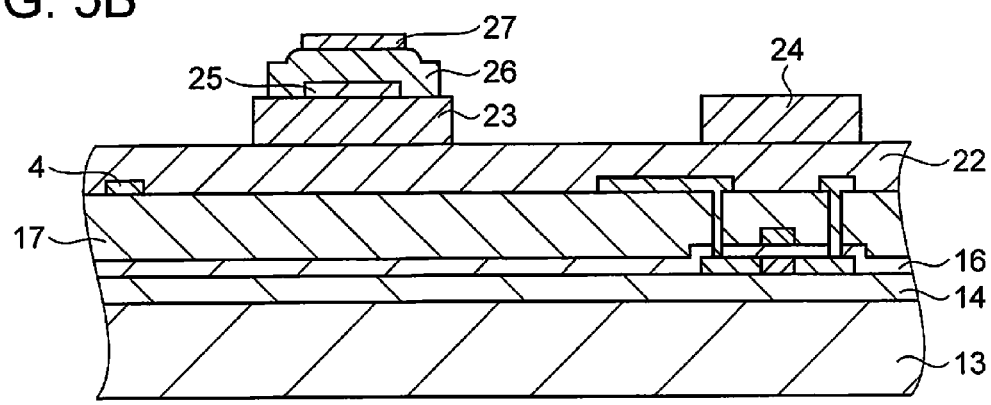

As shown in FIG. 5A, the third unpatterned semiconductor film 33 is patterned by photolithography or the like to form the third semiconductor layer 27. Next, the second unpatterned semiconductor film 32 is patterned by photolithography or the like to form the second semiconductor layer 26. Subsequently, as shown in FIG. 5B, the aluminum film 31 is patterned by photolithography or the like to form the lower electrode 23 and the shading film 24.

Figure 5C:
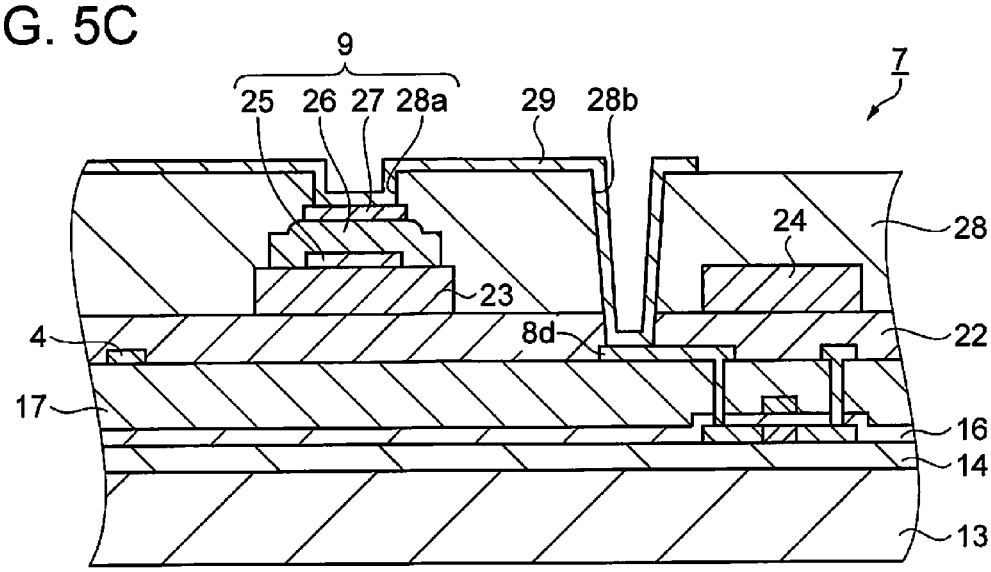

Next, as shown in FIG. 5C, an Si$_3$N$_4$ film having a film thickness of about 1200 nm is formed, so as to cover the second interlayer insulation film 22, the lower electrode 23, the shading film 24, the first semiconductor layer 25, the second semiconductor layer 26 and the third semiconductor layer 27, thus forming the third interlayer insulation film 28. Thereafter, the contact hole 28a that reaches the third semiconductor layer 27 is formed in the third interlayer insulation film 28. The contact hole 28b that passes through the third interlayer insulation film 28 and the second interlayer insulation film 22 to reach the drain electrode 8d is formed. Thereafter, an ITO film having a film thickness of about 100 nm is formed by sputtering or the like on the third interlayer insulation film 28 and in the contact hole 28a and the contact hole 28b. Next, the ITO film is patterned by photolithography to form the transparent electrode 29. The photo sensors 7 are formed by the above processes.

As mentioned above, the following effects are obtained according to the present embodiment.

(1) According to the present embodiment, the outer periphery 26a of the second semiconductor layer 26 is located on the outer side of the first semiconductor layer 25 in plan view. Thus, the outer periphery 26a of the second semiconductor layer 26 is disposed on the outer side of the place between the first semiconductor layer 25 and the third semiconductor layers 27. In the photodiode 9, the place where current tends to leak, which is the outer periphery 26a of the second semiconductor layer 26, is provided so as to be separated from the place sandwiched by the first semiconductor layer 25 and the third semiconductor layer 27. Accordingly, a configuration in which current leakage does not readily occur in the photodiode 9 when the photodiode 9 is not irradiated with the light 30 can be realized.

(2) According to the present embodiment, the second semiconductor layer 26 is thicker than the first semiconductor layer 25 and the third semiconductor layer 27. The second semiconductor layer 26 is an i-type semiconductor layer, and the i-type semiconductor layer absorbs energy from light and causes electricity to flow. Accordingly, since light is converted into electricity more efficiently when the i-type semiconductor layer is thicker rather than thinner, the photodiode 9 is able to efficiently cause current corresponding to the light to flow.

Second Embodiment

Figure 6:
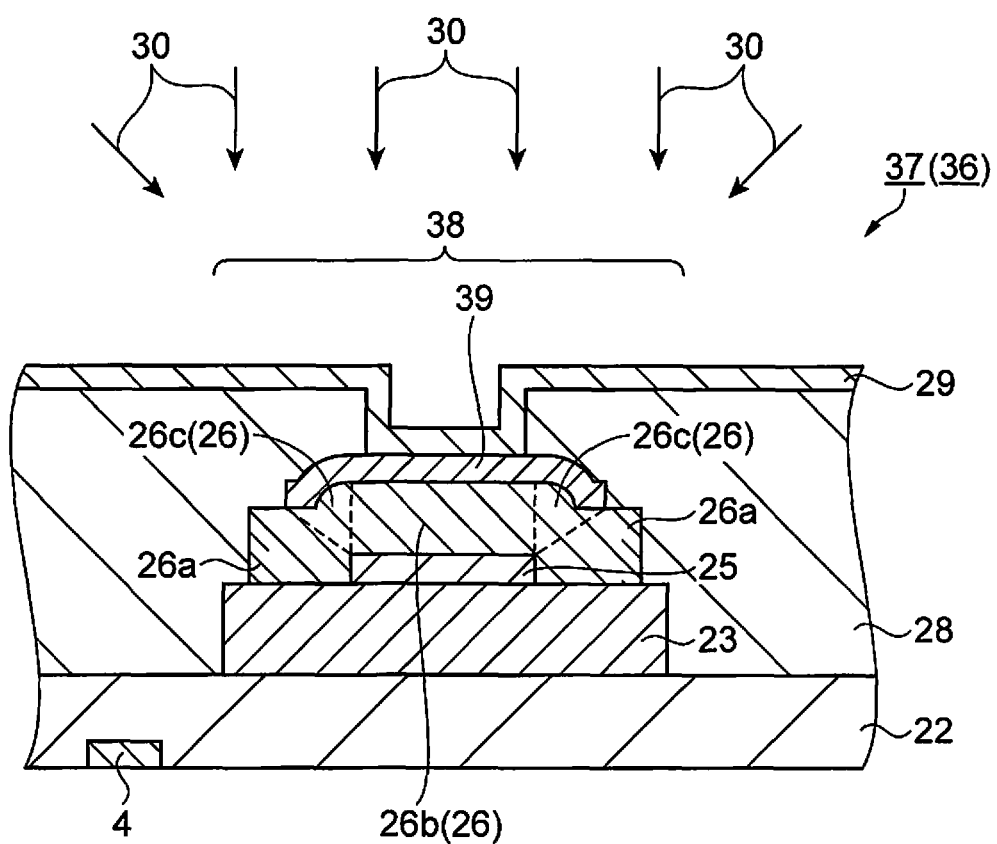
FIG. 6 is a schematic enlarged cross-sectional view showing a main section of the structure of a photo sensor relating to a second embodiment.

Next, an embodiment of a photodiode will be described using a schematic enlarged cross-sectional view of FIG. 6 showing a main section of the structure of a photo sensor. The present embodiment differs from the first embodiment in that the third semiconductor layer 27 shown in FIG. 3 differs in shape. Note that, in subsequent embodiments including the present embodiment, the same reference signs are given to parts that are the same as the first embodiment, and description thereof may be omitted.

That is, in the present embodiment, as shown in FIG. 6, an image sensor 36 serving as a photoelectric conversion apparatus is provided with a photo sensor 37 serving as a photoelectric conversion element, and a photodiode 38 is provided in the photo sensor 37. In the photodiode 38, the first semiconductor layer 25, the second semiconductor layer 26 and the third semiconductor layer 39 are laminated on the lower electrode 23 in the stated order. The third semiconductor layer 39 is disposed on the inner side of the outer periphery 26a of the second semiconductor layer 26.

The third semiconductor layer 39 includes a place opposing the first semiconductor layer 25 and is larger in area than the first semiconductor layer 25 in plan view. In other words, the third semiconductor layer 39 is provided in a place corresponding to the surrounding area of the first semiconductor layer 25 in plan view, in addition to a place opposing the first semiconductor layer 25. The region of the second semiconductor layer 26 opposing the first semiconductor layer 25 is given as a first region 26b. Localities of the second semiconductor layer 26 between the first semiconductor layer 25 and the third semiconductor layer 39 other than the first region 26b are given as a second region 26c. The area of the first region 26b is the same as the area of the first semiconductor layer 25 in plan view. Accordingly, the combined area of the first region 26b and the second region 26c in plan view is larger than the area of the first semiconductor layer 25.

The second region 26c does not oppose the first semiconductor layer 25, but is located between the first semiconductor layer 25 and the third semiconductor layer 39 when seen from the oblique direction in FIG. 6. Accordingly, when the second region 26c is irradiated with the light 30, current also flows in the second region 26c between the first semiconductor layer 25 and the third semiconductor layer 39. Accordingly, current corresponding to the light 30 can be efficiently caused to flow compared with the first embodiment, as a result of having increased the area by adding the second region 26c to the first region 26b. As a result, the intensity of the light 30 is also converted into electricity by light incident on the second semiconductor layer 26 that is located in the surrounding area of the first semiconductor layer 25 in plan view, enabling current corresponding to the intensity of the light 30 to be efficiently caused to flow.

Third Embodiment

Figure 7:
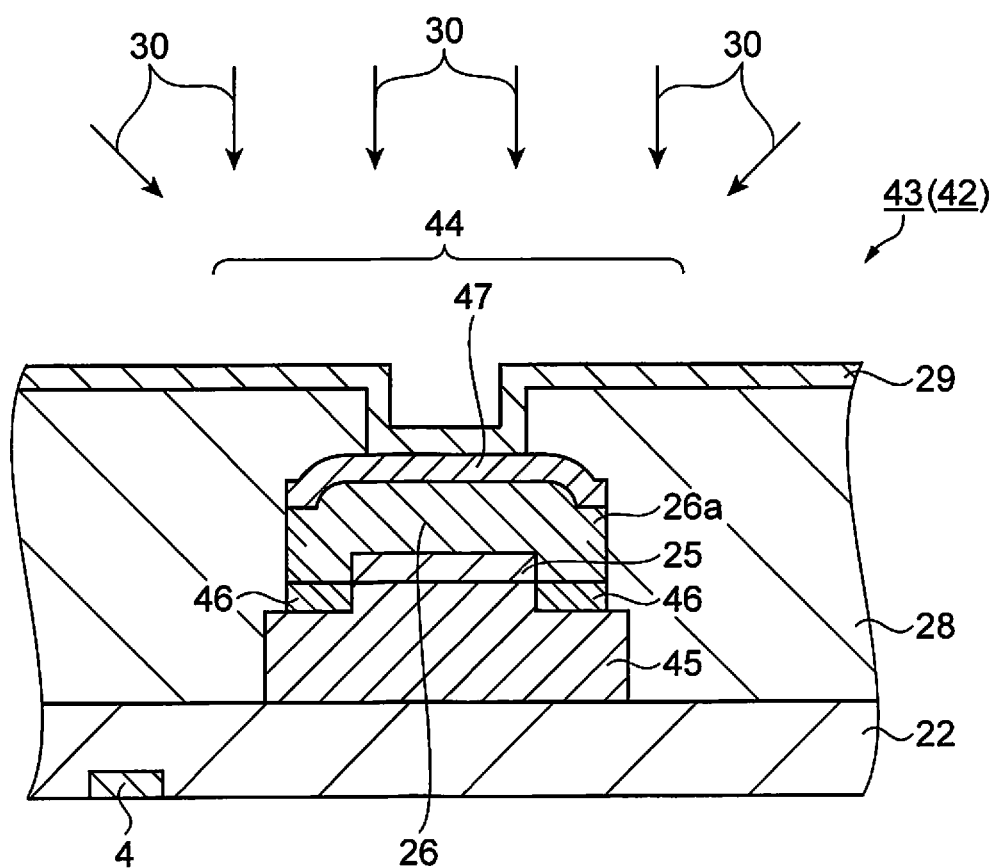
FIG. 7 is a schematic enlarged cross-sectional view showing a main section of the structure of a photo sensor relating to a third embodiment.

Next, an embodiment of a photodiode will be described using a schematic enlarged cross-sectional view of FIG. 7 showing a main section of the structure of a photo sensor. The present embodiment differs from the first embodiment in that the third semiconductor layer 27 and the second semiconductor layer 26 shown in FIG. 3 are the same shape in plan view.

That is, in the present embodiment, as shown in FIG. 7, an image sensor 42 serving as a photoelectric conversion apparatus is provided with a photo sensor 43 serving as a photoelectric conversion element, and a photodiode 44 is provided in the photo sensor 43. In the photodiode 44, a lower electrode 45 is provided on the second interlayer insulation film 22, and an insulating layer 46, the first semiconductor layer 25, the second semiconductor layer 26, and a third semiconductor layer 47 are laminated on the lower electrode 45 in the stated order.

In the lower electrode 45, a place opposing the first semiconductor layer 25 protrudes and is connected to the first semiconductor layer 25. The insulating layer 46 is provided between the lower electrode 45 and the second semiconductor layer 26. Accordingly, the second semiconductor layer 26 is electrically connected to the lower electrode 45 via the first semiconductor layer 25, and current does not flow directly from the second semiconductor layer 26 to the lower electrode 45. The third semiconductor layer 47 is provided overlapping the second semiconductor layer 26.

The second semiconductor layer 26 and the third semiconductor layer 47 have the same planar shape in plan view. Accordingly, it is possible for current to flow from the third semiconductor layer 47 to the second semiconductor layer 26 at all places. As a result, current corresponding to the light can be efficiently caused to flow.

The outer periphery 26a of the second semiconductor layer 26 is separated from the first semiconductor layer 25. Flow of current between the first semiconductor layer 25 and the third semiconductor layer 47 through the outer periphery 26a of the second semiconductor layer 26 is thereby suppressed. Also, the insulating layer is provided between the outer periphery 26a of the second semiconductor layer 26 and the lower electrode 45. The flow of current between the lower electrode 45 and the third semiconductor layer 47 through the outer periphery 26a of the second semiconductor layer 26 is thereby suppressed. Although current flows readily through the outer periphery 26a of the second semiconductor layer 26 when impurities adhere to the outer periphery 26a or lattice defects occur therein, a structure that suppresses current leakage caused by this can be realized.

Fourth Embodiment

Figure 8A:
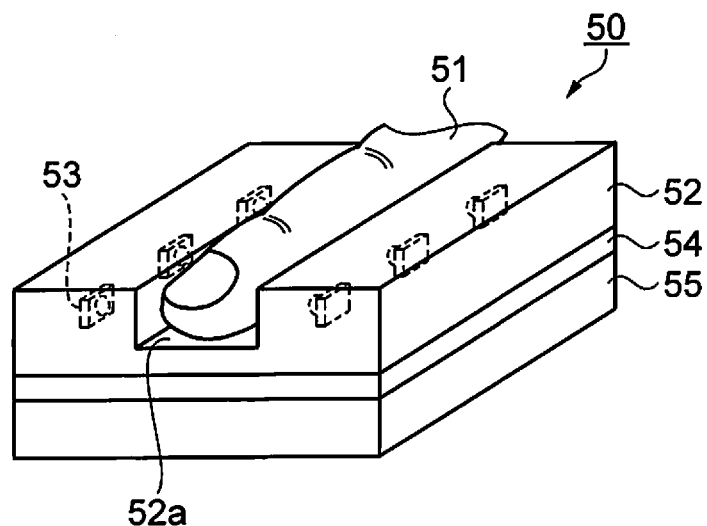
FIGS. 8A and 8B relate to a fourth embodiment, with FIG. 8A being a schematic perspective view showing the structure of a biometric authentication apparatus, and FIG. 8B being a schematic cross-sectional view showing the structure of the biometric authentication apparatus.
Figure 8B:
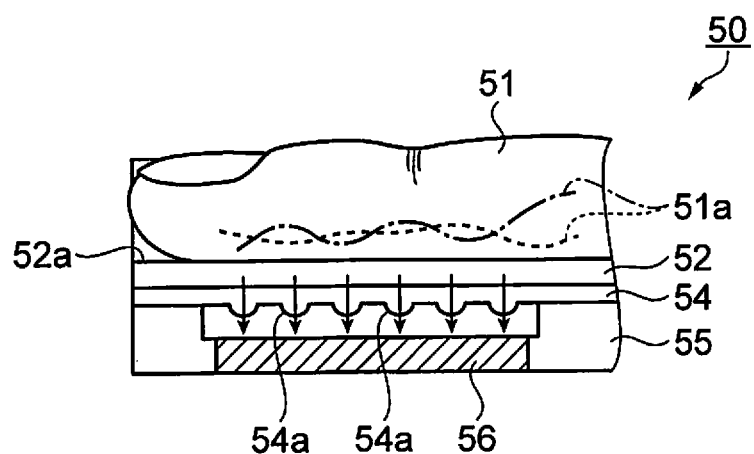

Next, a biometric authentication apparatus using the above image sensors will be described with reference to FIG. 8. FIG. 8A is a schematic perspective view showing the structure of the biometric authentication apparatus, and FIG. 8B is a schematic cross-sectional view showing the structure of the biometric authentication apparatus.

As shown in FIG. 8, a biometric authentication apparatus 50 serving as an electronic device detects and captures the light 30 consisting of reflected light from a finger 51 and scattered light in the finger 51. An image of a vein pattern 51*a* is thereby captured. The biometric authentication apparatus 50 compares the captured image with the vein pattern of each person who has been registered, and identifies and authenticates the person whose finger is held up to the biometric authentication apparatus 50.

The biometric authentication apparatus 50 is provided with a subject receiving part 52 having a groove 52*a* for guiding a finger that is held up to the biometric authentication apparatus 50 to a predetermined place. A plurality of light sources 53 are built into the subject receiving part 52 so as to be disposed on both sides along the groove 52*a*. The light source 53 emits near-infrared light other than visible light in order to capture the vein pattern without being affected by outside light. Light emitting diodes (LEDs), EL (electro luminescence) elements or the like are used for the light sources 53.

A micro lens array 54 is provided on the lower side of the subject receiving part 52 in the diagram, and micro lenses 54*a* are provided in an array in the micro lens array 54. An image capturing part 55 is provided on the lower side of the micro lens array 54 in the diagram. An image sensor 56 serving as a photoelectric conversion apparatus is provided in the image capturing part 55.

A finger having the vein pattern 51*a* is irradiated by light from the light sources 53. Reflected light of the light irradiated onto the finger and scattered light inside the finger are focused toward the image sensor 56 by the micro lenses 54*a* provided in the micro lens array 54. Photo sensors are provided in an array in the image sensor 56. The micro lenses 54*a* may be provided in correspondence with each photo sensor of the image sensor 56. Also, the micro lenses 54*a* may be provided so as to be paired with a plurality of photo sensors.

Note that an optical compensation plate that compensates for luminance unevenness in light illuminated by the plurality of light sources 53 may be provided between the subject receiving part 52 incorporating the light sources 53 and the micro lens array 54. The image sensor 56 captures the vein pattern 51*a* illuminated with near-infrared light. The biometric authentication apparatus 50 is provided with a storage part and an image operation part that are not shown. The vein pattern 51*a* of each person who has been registered is stored in the storage part.

The image operation part searches the data of the vein pattern 51*a* of each person who has been registered for the same vein pattern 51*a* as the image of the captured vein pattern 51*a*. When the same vein pattern 51*a* as the captured vein pattern 51*a* is found, the person whose finger is held up to the biometric authentication apparatus 50 is identified and authenticated.

Any of the image sensor 1, the image sensor 36 or the image sensor 42 described above is used for the image sensor 56. Accordingly, because leakage current is suppressed, the photodiodes provided in the image sensor 56 are able to detect the intensity of the light 30 with high quality. As a result, the biometric authentication apparatus 50 is able to perform accurate detection even with the vein pattern 51*a* resulting from light 30 of low intensity.

Fifth Embodiment

Figure 9:
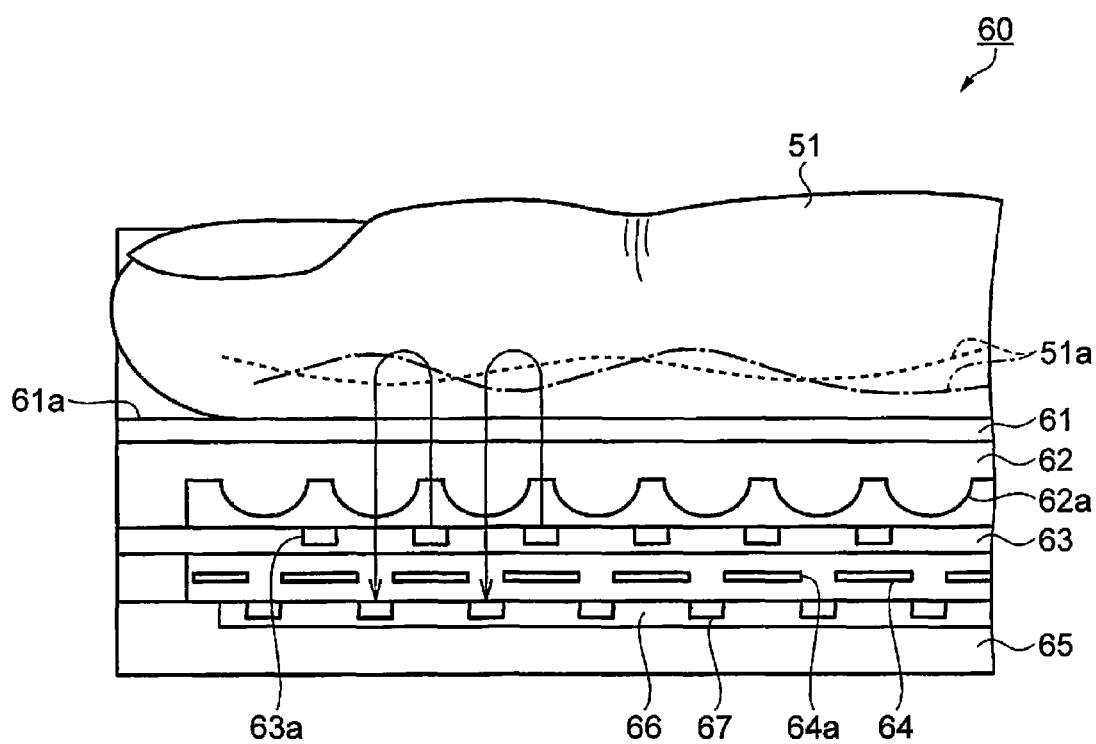
FIG. 9 is a schematic cross-sectional view showing the structure of a biometric authentication apparatus relating to the fifth embodiment.

Next, a biometric authentication apparatus using the above image sensors will be described with reference to FIG. 9. FIG. 9 is a schematic cross-sectional view showing the structure of the biometric authentication apparatus. The present embodiment differs from the fourth embodiment in that the arrangement of the light sources 53 differs.

As shown in FIG. 9, a biometric authentication apparatus 60 serving as an electronic device detects and captures the light 30 consisting of reflected light from the finger 51 and scattered light in the finger 51. The biometric authentication apparatus 60 compares the captured image with the vein pattern of each person who has been registered, and identifies and authenticates the person whose finger is held up to the biometric authentication apparatus 60.

The biometric authentication apparatus 60 is provided with a subject receiving part 61 provided with a groove 61*a* that guides a finger held up to the biometric authentication apparatus 60 to a predetermined place. The subject receiving part 61 has a similar shape to the subject receiving part 52 of the fourth embodiment. A micro lens array 62 is provided on the lower side of the subject receiving part 61 in the diagram, and micro lenses 62*a* are provided in an array along the groove 61*a* in the micro lens array 62.

A light source part 63 is provided on the lower side of the micro lens array 62 in the diagram, and light sources 63*a* that are arrayed along the groove 61*a* are built into the light source part 63. The light sources 63*a* are provided in places opposing areas between adjacent micro lenses 62*a*. The light sources 63*a* emit near-infrared light other than visible light in order to capture the vein pattern without being affected by outside light. Light emitting diodes (LED), EL elements or the like are used for the light sources 63*a*.

A shading plate 64 is provided on the lower side of the light source part 63 in the diagram. Holes 64*a* are provided in an array in the shading plate 64 in places opposing the micro lenses 62*a*. An image capturing part 65 is provided on the lower side of the shading plate 64 in the diagram. An image sensor 66 serving as a photoelectric conversion apparatus is provided in the image capturing part 65. Photodiodes 67 are provided in an array in the image sensor 66. The photodiodes 67 are disposed in places opposing the holes 64*a* of the shading plate 64.

A finger having the vein pattern 51*a* is irradiated with light from the light sources 63*a*, and the resultant reflected light and scattered light are focused toward the image sensor 66 by the micro lenses 62*a* provided in the micro lens array 62. The shading plate 64 is provided between the micro lens array 62 and the image sensor 66, and the light focused by the micro lenses 62*a* passes through the holes 64*a* of the shading plate 64 and is incident on the photodiodes 67. Light that travels directly towards the image sensor 66 from the light sources 63*a* is blocked by the shading plate 64. Accordingly, a sharp image of the vein pattern 51*a* can be captured in the image sensor 66.

The image sensor 66 captures the vein pattern 51*a* illuminated with near-infrared light. The biometric authentication apparatus 60 is provided with a storage part and an image operation part that are not shown. The vein pattern 51*a* of each person who has been registered is stored in the storage part. The image operation part searches the data of the vein pattern 51*a* of each person who has been registered for the same vein pattern 51*a* as the image of the captured vein pattern 51*a*. When the same vein pattern 51*a* as the captured vein pattern 51*a* is found, the person whose finger is held up to the biometric authentication apparatus 60 is identified and authenticated.

Any of the image sensor 1, the image sensor 36 or the image sensor 42 described above is used for the image sensor 66. Accordingly, because leakage current is suppressed, the photodiodes 67 that are provided in the image sensor 66 are able to detect the intensity of the light 30 with high quality. As a result, the biometric authentication apparatus 60 is able to perform accurate detection even with the vein pattern 51a resulting from light 30 of low intensity.

Note that the embodiments are not limited to the abovementioned embodiments, and it is possible for a person with ordinary skill in the art to apply various changes, improvements and the like to the abovementioned embodiments within the technical idea of the invention. Modifications are described below.

Modification 1

In the first embodiment, the first semiconductor layer 25 was an n-type semiconductor layer, and the third semiconductor layer 27 was a p-type semiconductor layer. The first semiconductor layer 25 may be a p-type semiconductor layer, and the third semiconductor layer 27 may be an n-type semiconductor layer. The flow of current in the photodiode 9 can also be realized according to the intensity of the irradiated light 30 in this case. A structure that facilitates manufacturing may also be an adopted.

Modification 2

In the first embodiment, the photo sensors 7 were arrayed in a two-dimensional matrix on the image sensor 1. An image sensor may be configured with the photo sensors 7 arrayed in a row. Also, an image sensor may be configured with only one photo sensor 7 provided. A configuration may be adopted according to the application of the image sensor.

Modification 3

In the first embodiment, the terminals of the photodiode 9 are connected to the drain electrode 8d. The electrical configuration of the photodiode 9 and connection thereof are not limited thereto. For example, the electrical output from the photodiode 9 may be connected to the gate electrode 8g of the thin film transistor 8, and a circuit may be configured to detect received light as the change in voltage or current between the source electrode 8s and the drain electrode 8d.

What is claimed is:

1. A photoelectric conversion apparatus comprising:
a substrate; and
a light detection part including a first semiconductor layer, a second semiconductor layer and a third semiconductor layer, the first semiconductor layer, the second semiconductor layer and the third semiconductor layer being laminated on the substrate in order of the first semiconductor layer, the second semiconductor layer, and the third semiconductor layer in a first direction,
the second semiconductor layer being an i-type semiconductor layer, and one of the first semiconductor layer and the third semiconductor layer being an n-type semiconductor layer and the other being a p-type semiconductor layer,
the first semiconductor layer being covered by the second semiconductor layer,
the third semiconductor layer having an area that is smaller than an area of the second semiconductor layer in a plan view from a thickness direction of the substrate,
the second semiconductor layer having a first portion that overlaps the first semiconductor layer in the first direction, a second portion that does not overlap the first semiconductor layer in the first direction, and a third portion that does not overlap the first semiconductor layer in the first direction and is disposed between the first and second portions in a second direction perpendicular to the first direction, the second portion having a first surface and a second surface opposite the first surface in the first direction, the first surface being closer to the substrate than the second surface in the first direction, each of the first and third portions having a part that is positioned farther from the substrate in the first direction than the second surface of the second portion,
the third semiconductor layer overlapping at least the first portion and the third portion in the first direction.

2. The photoelectric conversion apparatus according to claim 1, wherein the third semiconductor layer includes a place opposing the first semiconductor layer and is larger in area than the first semiconductor layer in the plan view from the thickness direction of the substrate.

3. The photoelectric conversion apparatus according to claim 1, wherein the second semiconductor layer is thicker than the first semiconductor layer, and the second semiconductor layer is thicker than the third semiconductor layer.

4. An electronic device comprising a photoelectric conversion apparatus, wherein the photoelectric conversion apparatus is the photoelectric conversion apparatus according to claim 1.

5. The photoelectric conversion apparatus according to claim 1, wherein
the first portion has a third surface and a fourth surface opposite the third surface in the first direction, and the third surface is closer to the substrate than the fourth surface in the first direction,
the first surface of the second portion is arranged closer to the substrate than the third surface of the first portion in the first direction, and
the second surface is arranged closer to the substrate than the fourth surface of the first portion in the first direction.

6. A photoelectric conversion apparatus comprising:
a substrate; and
a first electrode disposed on the substrate in a thickness direction of the substrate, the first electrode including a non-protruding portion and a protruding portion protruding from the non-protruding portion in the thickness direction;
an insulating layer disposed on the non-protruding portion in the thickness direction,
a light detection part including
a first semiconductor layer disposed on the protruding portion in the thickness direction,
a second semiconductor layer disposed on the first semiconductor layer and the insulating layer in the thickness direction, the second semiconductor layer being an i-type semiconductor layer, and
a third semiconductor layer disposed on the second semiconductor layer in the thickness direction, one of the first semiconductor layer and the third semiconductor layer being an n-type semiconductor layer and the other being a p-type semiconductor layer; and
a second electrode disposed on the third semiconductor layer in the thickness direction,
the second semiconductor layer having a dimension in a perpendicular direction perpendicular to the thickness direction, which is equal to a total of a dimension of the first semiconductor layer and a dimension of the insulating layer in the perpendicular direction.

* * * * *